United States Patent [19]

Kuhn-Kuhnenfeld et al.

[11] 4,330,361
[45] May 18, 1982

[54] PROCESS FOR THE MANUFACTURE OF HIGH-PURITY MONOCRYSTALS

[75] Inventors: Franz Kuhn-Kuhnenfeld; Franz Köhl, both of Burghausen, Fed. Rep. of Germany; Friedrich Nemetz, Mauerkirchen; Gerhard Zechmeister, Braunau, both of Austria

[73] Assignee: Wacker-Chemitronic Gesellschaft für Elektronic-Grundstoffe mbH, Burghausen, Fed. Rep. of Germany

[21] Appl. No.: 232,277

[22] Filed: Feb. 6, 1981

[30] Foreign Application Priority Data

Feb. 14, 1980 [DE] Fed. Rep. of Germany ....... 3005492

[51] Int. Cl.³ .............................................. C30B 15/20
[52] U.S. Cl. .............................. 156/617 SP; 422/249
[58] Field of Search ......... 156/617 SP, 608, DIG. 64; 422/246, 249

[56] References Cited

U.S. PATENT DOCUMENTS 2,956,863 10/1960 Goorissen ..................... 156/617 SP
3,716,345 2/1973 Grabmaier ........................... 422/249

FOREIGN PATENT DOCUMENTS 2821481 11/1979 Fed. Rep. of Germany ...... 422/249
1316707 12/1961 France ......................... 156/617 SP
2013820 4/1970 France ......................... 156/617 SP
136003 6/1979 German Democratic Rep. ............................. 156/617 SP

OTHER PUBLICATIONS

Hull et al., IBM Technical Disclosure Bulletin, vol. 19, #3, Aug. 1976, pp. 869–870.

*Primary Examiner*—Gregory N. Clements
*Attorney, Agent, or Firm*—Allison C. Collard; Thomas M. Galgano

[57] ABSTRACT

In the crucible-pulling of crystalline rods by the Czochralski technique, pulling plants that operate with a radiation screen offer a number of advantages. This process is optimized according to the invention by the use of a radiation screen which is joined to a lifting and pivoting mechanism that can be operated throughout the entire pulling process, and which is brought into position above the melt only when the contents of the crucible have been melted.

3 Claims, 1 Drawing Figure

U.S. Patent May 18, 1982 4,330,361
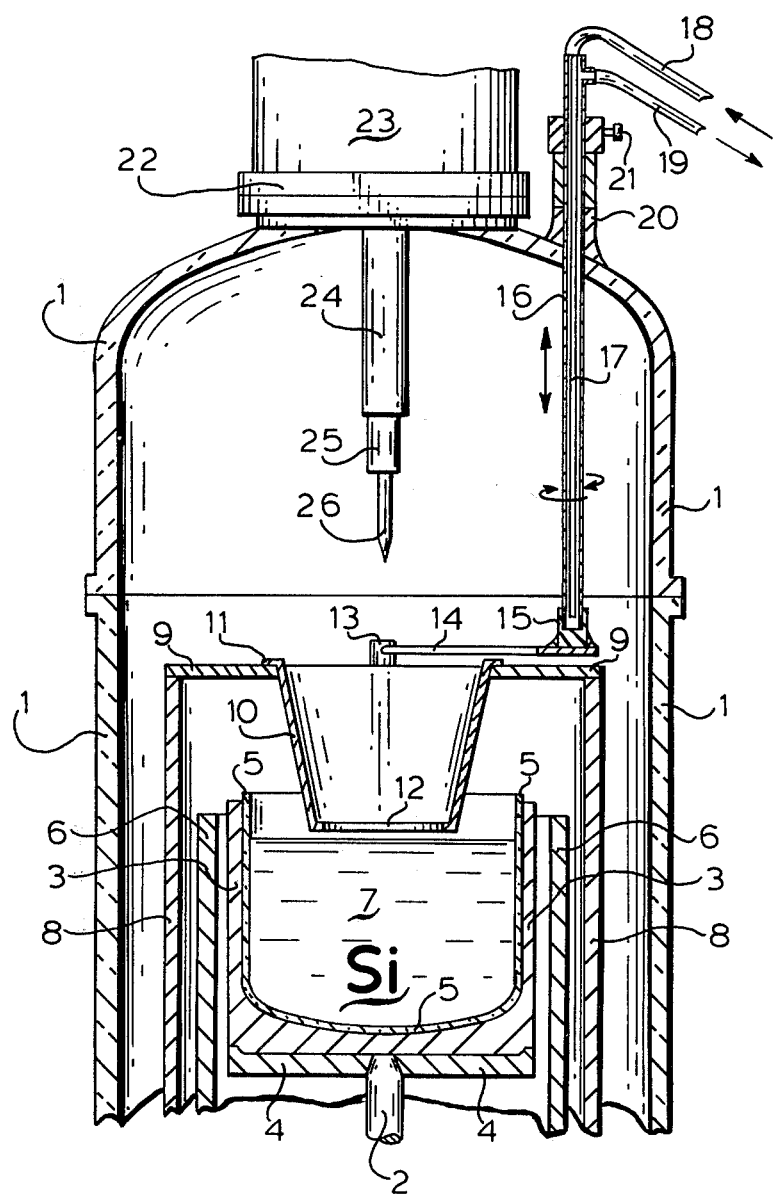

PROCESS FOR THE MANUFACTURE OF HIGH-PURITY MONOCRYSTALS

The present invention relates to a process for the manufacture of high-purity monocrystals by the Czochralski crucible-pulling technique using a radiation screen.

Pulling speeds customarily achieved in crucible-free zone pulling cannot even be approximately achieved in the known Czochralski crucible-pulling methods, owing to poor heat dissipation through the rod. The reason for this lies in the irradiation of heat from the melt and the crucible wall onto the growing crystalline rod. When pulling silicon rods, for example, there is the additional fact that the reaction of the silicon melt with the quartz crucible containing the melt produces volatile silicon monoxide, which is deposited on the cooler edge of the crucible, on the silicon rod, on the pulling shaft, and on the inner wall of the pulling vessel.

To counteract these disadvantages and, in particular, to achieve increased pulling speeds, it has been proposed that a ring-shaped screen having a central opening for the growing crystalline rod be arranged over the melt for the duration of the process (German Patentschrift No. 16 19 966). Alternatively, in order to effectively screen heat irradiation from the crucible and the heater surrounding it, it has been proposed to screen off those parts and also the melt itself using a pot-like radiation screen of, for example, molybdenum (German Offenlegungsschrift No. 28 21 481).

Problems can arise in these processes, however, because the radiation screen may become splashed during the melting phase and, as a result, the screen may be partially dissolved, leading to undesirable doping of the melt by the material of the radiation screen. In addition, particularly in the process using the pot-like screen, the optimum melting position of the crucible and changes in the vertical position of the crucible during the melting process may be hindered by the radiation screen.

It is therefore the object of the invention to further optimize the above-mentioned process by eliminating the aforesaid difficulties.

This object is achieved according to the process of the present invention by joining the radiation screen to a lifting and pivoting mechanism that can be operated throughout the entire pulling process, and by bringing it into position only when the contents of the crucible have been melted. For this purpose, the annular, pot-shaped or cylindrical radiation screen, which covers one or more of the heater elements, the exposed inner wall of the melting crucible, and the melt, except for the opening for the passage of the growing crystalline rod, is provided with a lifting and pivoting mechanism that enables the radiation screen to be pivoted inwardly over the crucible and lowered until it lies closely above the surface of the melt, only after the melt material (normally introduced into the crucible in lump form) has been completely melted. The subsequent actual pulling process is then carried out in the usual manner; for example, in accordance with the process parameters described in the above-mentioned patent specifications.

As a result of the process according to the invention, the problems described above that typically occur in crucible-pulling processes using a melt cover are avoided and, in addition, the seeding times, i.e., the time taken for a dislocation-free crystalline portion to be grown onto the seed crystal immersed in the melt, are considerably reduced. This enables the output of the pulling plant to be increased significantly. A further advantage lies in the fact that the residual melt, which always remains in the crucible, can be removed by suction when the partial melt cover has been raised. Consequently, breakage of the expensive quartz-glass crucible, which generally occurs as the silicon solidifies, because it expands as it solidifies, can be avoided.

Other objects and features of the present invention will become apparent from the following detailed description when taken in connection with the accompanying drawing which discloses one embodiment of the invention. It is to be understood that the drawing is designed for the purpose of illustration only, and is not intended as a definition of the limits of the invention.

In the drawing, a pulling device for carrying out the process according to the invention is schematically illustrated in a side, sectional view, in part elevation.

Referring now in detail to the drawing, a quartz crucible 5 surrounded by a graphite crucible 3 which, in turn, rests on a graphite plate 4, is arranged in a container 1. Crucible 5 can be moved vertically by means of a crucible shaft 2 and it contains a melt material 7 which is required for the manufacture of the particular monocrystal, for example, silicon; the same having been melted by the heating element 6. This arrangement is enclosed by a graphite tube 8, on the top edge of which rests a graphite ring 9.

In this particular case, the partial melt cover consists of a pot-like, downwardly-tapering radiation screen 10 made from, for example, molybdenum sheet, which, at its top end, has an outwardly-directed annular flange 11 which rests on the graphite ring 9. At its lower end, the radiation screen is bent slightly inwardly to form an adequate circular opening 12 for the passage of the growing crystalline rod. At the top end of radiation screen 10 is a holding device 13 which is joined by a rod 14 and another holding device 15 to a vertically movable tube 16 which is rotatable about its longitudinal axis. A second thin tube 17 discharges into tube 16 and a coolant, for example, water, can be introduced into tube 16 through a tubular supply line 18 and through tube 17, the coolant emerging again through an outlet 19. This internally-cooled tube 16, for executing the lifting and pivoting movements of the partial melt cover 10, can be fixed in the desired position in a special gas-tight passage 20 at the top end of the container 1 by means of an adjustment screw 21. A seed crystal 26, secured by a joining piece 25 to a pulling shaft 24, can be lowered into melt 7 from a tubular structure 23 attached to the top end of container 1 by means of a flange 22.

The invention will now be described by way of an example, which is given by way of illustration and not of limitation.

EXAMPLE 15.5 kg of polycrystalline silicon were weighed into a quartz-glass crucible having a height of 165 mm and a diameter of 270 mm. After installation of the crucible in the pulling apparatus described above and illustrated in the drawing, the polycrystalline silicon was melted under an argon pressure of 10 mbar with a flow rate of 800 liters of argon per hour (measured at standard temperature and pressure). During the melting, the crucible was raised several times to compensate for the fall in the level of the polycrystalline silicon in the crucible, as a result of the melting.

When melting was completed, a radiation screen of molybdenum, as illustrated in the drawing, having a height of 155 mm, a top diameter of 240 mm and, at its lower end, a pulling opening for the growing crystalline rod of 145 mm diameter, was pivoted over the crucible and lowered over the melt until it came to rest with its outwardly-directed annular flange at its top end, supported by the graphite ring of the graphite tube surrounding the crucible arrangement. By subsequently adjusting the vertical position of the crucible, a distance of approximately 15 mm was established between the lower edge of the partial melt cover and the surface of the melt.

The seed crystal was subsequently immersed in the melt and a monocrystal was grown onto it and built up to a diameter of approximately 104 mm in a conventional manner over a period of approximately 3 hours.

In the cylindrical region of the rod, the crystal was pulled at a speed of 2 mm per minute, with a crystal rotation of 20 revolutions per minute and with a counter-rotation of the crucible at a rate of 5 revolutions per minute.

When pulling of the rod was completed, a dislocation-free rod having a cylindrical rod length of 69 cm was obtained which was removed upwardly out of the container. The partial melt cover was then raised, pivoted to one side, and parallelepiped- or cuboid-shaped carbon felt measuring 25×10×2.5 cm fastened to the end of a stainless steel rod was immersed at an angle into the residual melt until it touched the bottom of the crucible. When, after a few minutes, the carbon felt had absorbed the residual melt, it was raised a few centimeters above the bottom of the crucible and the temperature of the apparatus was allowed to fall to room temperature. After being washed out with an acid mixture, the quartz crucible from which the residual melt had been removed, was ready for a second batch.

Thus, while only one embodiment of the present invention has been shown and described, it will be obvious that many changes and modifications may be made thereunto, without departing from the spirit and scope of the invention.

What is claimed is:

1. In a process for the manufacture of high-purity monocrystals by the Czochralski crucible-pulling technique wherein a crystalline rod is pulled from a melt contained in a crucible at least partially covered by a radiation screen having a central opening formed therethrough for passage of the crystalline rod being pulled, the improvement comprising the steps of:

joining said radiation screen to a lifting, lowering and pivoting mechanism operable throughout the entire pulling process for moving said screen between an inoperative and operative position, in the former of which said screen is positioned spaced from and to the side of said crucible and in the latter of which said screen is brought into a position spaced above the melt contained in the crucible, and at least partially within the mouth of said crucible;

moving said radiation screen from said operative position to said inoperative position before introducing the melt material into the crucible by lifting said screen from the mouth of said crucible and pivoting it to a position spaced from and to the side of said crucible and maintaining said screen in said inoperative position during the melting of said melt material in said crucible; and moving said radiation screen from said inoperative position to said operative position after the melt material in the crucible has been melted by pivoting said screen to a position above said crucible and lowering it at least partially, into the mouth thereof to a position at which it is spaced above said melt with a portion thereof so positioned to shield the crystalline rod subsequently pulled through the opening thereof at least partially from the heat radiated by an exposed inner wall of the crucible.

2. The process according to claim 1, wherein following the pulling of said crystalline rod, said radiation screen is moved from said operative to said inoperative position by lifting it from the mouth of the crucible and pivoting it to the side of the crucible and thereafter the residual melt remaining in the crucible is withdrawn.

3. The process according to claim 1, wherein said melt comprises a silicon melt.

* * * * *